(12) United States Patent
Kulangara et al.

(10) Patent No.: US 6,975,488 B1
(45) Date of Patent: Dec. 13, 2005

(54) SUSPENSION INTERCONNECT WITH CONTROLLED NOISE

(75) Inventors: Sivadasan Kulangara, Temecula, CA (US); Amanullah Khan, Temecula, CA (US)

(73) Assignee: Magnecomp Corporation, Temecula, CA (US)

(*) Notice: Subject to any disclaimer, the term of this patent is extended or adjusted under 35 U.S.C. 154(b) by 193 days.

(21) Appl. No.: 10/159,418

(22) Filed: May 29, 2002

Related U.S. Application Data

(60) Provisional application No. 60/376,977, filed on Apr. 30, 2002.

(51) Int. Cl.$^7$ ................................................. G11B 5/48
(52) U.S. Cl. ............................................................. 360/246
(58) Field of Search ............................. 360/246, 244.2, 360/244.4, 245.8, 245.9, 244.3, 244.5

(56) References Cited

U.S. PATENT DOCUMENTS

| | | | | |
|---|---|---|---|---|
| 5,805,382 A | * | 9/1998 | Lee et al. ................. | 360/244.1 |
| 5,812,344 A | * | 9/1998 | Balakrishnan ........... | 360/245.9 |
| 5,862,010 A | * | 1/1999 | Simmons et al. ........ | 360/97.01 |
| 6,295,183 B1 | * | 9/2001 | Nuno et al. .................. | 360/246 |
| 6,333,837 B1 | * | 12/2001 | Summers ..................... | 360/246 |

* cited by examiner

*Primary Examiner*—Tan Dinh
*Assistant Examiner*—Mark Blouin
(74) *Attorney, Agent, or Firm*—Louis J. Bachand

(57) ABSTRACT

A disk drive suspension and method has a metal load beam and an electrical interconnect assembly. The interconnect assembly has an insulative layer, a read pair of forward and return path conductive traces, a write pair of forward and return path conductive traces that are supported by the insulative layer, preferably in offset relation across the insulative layer, and a metal layer for grounding and mounted on the insulative plastic layer in fixed spaced relation to the conductive traces to be between the interconnect assembly and the load beam. The metal layer shields the conductive traces from variations in impedance occasioned by varying distances between said electrical interconnect and said load beam.

44 Claims, 3 Drawing Sheets

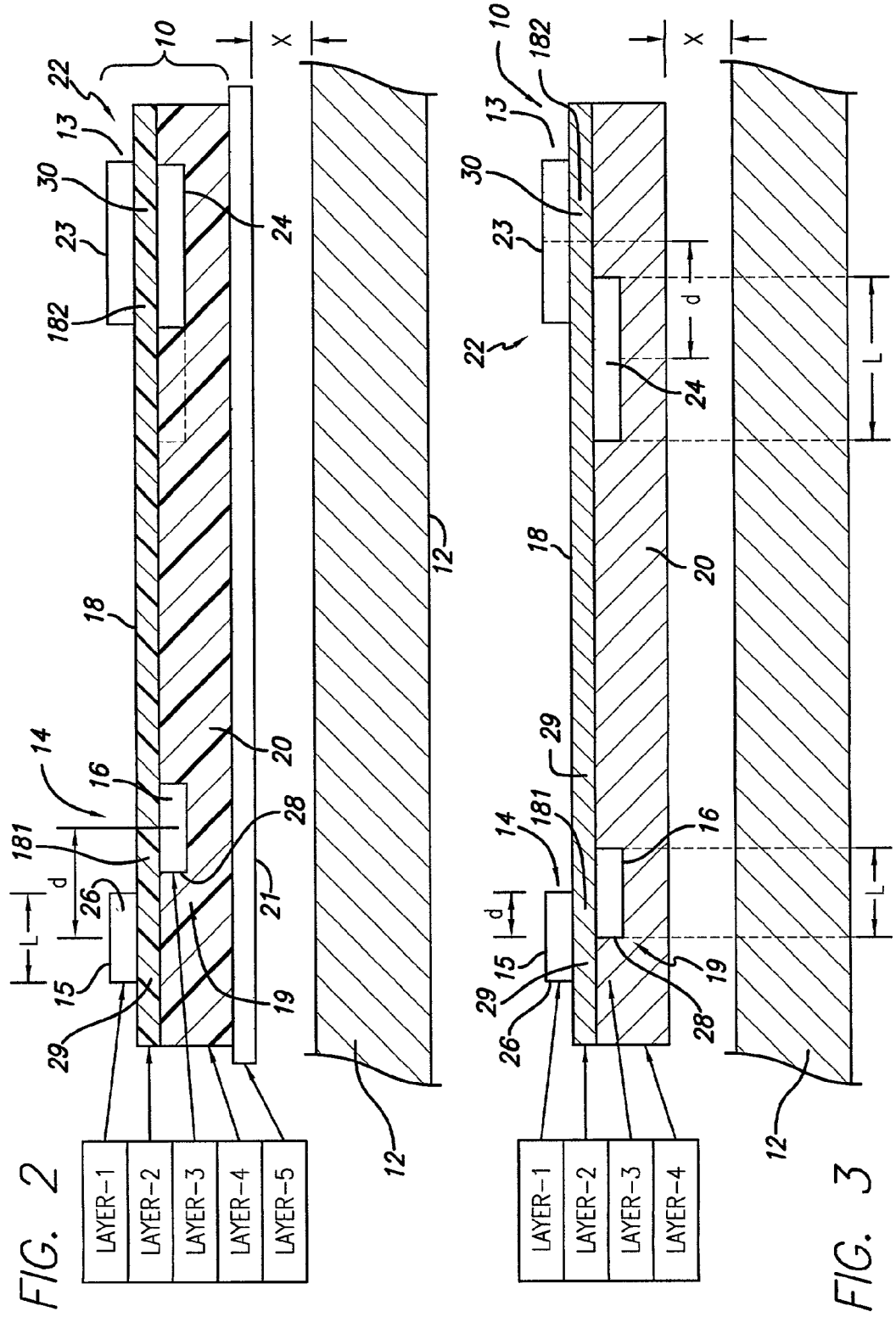

SUSPENSION INTERCONNECT WITH CONTROLLED NOISE

CROSS-REFERENCE TO RELATED APPLICATIONS

This application claims the benefit of U.S. Provisional Application Ser. No. 60/376,977 filed Apr. 30, 2002.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates to disk drive suspensions, and more particularly to disk drive suspensions including an electrical interconnect assembly adapted to be supported on a load beam, and to interconnect assemblies in combination with a load beam. The invention suspensions and interconnect assemblies provide enhanced performance through the optimized control of noise caused by impedance differences along the interconnect by spacing laterally the normally vertically superimposed signal forward and return paths of the read or write circuits, and, in some cases, adding a grounding layer between the conductive traces and the load beam.

2. Description of the Related Art

Disk drive interconnect assemblies in wireless suspensions are known that comprise plural pairs of trace conductors carried on a plastic insulative layer to form part of read and write circuits supported by a load beam. These trace conductor pairs are subject to noise from reflected impedance variations that degrades the integrity of the signals being sent through the trace conductors. Other impedance changes occur when the spacing of the trace conductors from the load beam changes over the mutual extents of the trace conductors and the metal load beam. Past efforts to control impedance through windowing, the removal of portions of metal locally opposite the trace conductors, appears to contribute to further local variations in impedance values.

BRIEF SUMMARY OF THE INVENTION

It is an object of the present invention to provide an improved disk drive suspension. It is a further object to provide an electrical interconnect for a disk drive suspension having noise control, including control of cross talk set up in one trace by changes in impedance in an adjacent trace, through management of impedance variations by opposing the read and or write circuit pair members in a novel manner involving offset partly or fully of the opposed pair members. Other variations in impedance stemming from changes in the distance between the traces and load beam are reduced or eliminated by reducing the effect of the load beam spacing through the use of a grounding layer of metal at a fixed spacing from the trace conductors. In this way the trace conductors are maintained at a fixed spacing from a conductor although the traces are at varying spacing from the load beam. A further object includes providing a read or write pair of forward and return path conductive traces bracketing an insulative layer, such as a plastic film layer in which the pair members are relatively laterally offset to differentially control impedance between the pair members of the read and/or write pairs. A further object is control of the effects of load beam spacing through the use of a metal layer constantly spaced from the traces and spaced as well from the load beam. The objects of the invention thus include provision of an electrical interconnect geometry that enhances electrical coupling between the forward and return paths of a differential circuit thereby making it less sensitive to exterior factors, noise and cross-talk, provision of a geometry that allows enhancement of capacitive coupling between the forward and return paths of a differential circuit, thereby making possible the realization of very low impedance interconnects, provision of a vertically stacked interconnect geometry that allows more circuits to be packed in a given area, provision of a shield that is electrically commonly grounded with the load beam to nearby metallic objects and supports the interconnect structure and that maintains a constant spacing from the differential circuit, the shield protecting the differential circuits from impedance variations caused by a non-uniform attachment process with the metallic supports, such as load beams and arms, provision of ripple-free differential (characteristic) impedance through homogenous shielding and uniform trace cross-sectional geometry, provision of smooth (continuous) control of differential impedance by setting the offset parameter to the desired value, provision of impedance control in which changing the impedance of a certain differential pair does not significantly affect the impedance of adjacent pairs, and provision of a flexure through the interconnect assembly.

These and other objects of the invention to become apparent hereinafter are realized in an electrical interconnect assembly, suitably attached to a load beam, or adapted to be supported on a disk drive suspension load beam, the interconnect assembly comprising a read pair of forward and return path conductive traces bracketing an insulative layer, and a write pair of forward and return path conductive traces bracketing an insulative layer, at least one of the read and write pairs having its forward and return path conductive traces being relatively laterally offset.

In this and like embodiments of the invention, typically, the read and write conductive traces bracket adjacent portions of a common electrically insulative layer, the conductive traces comprise copper, the write pair of forward and return path conductive traces are relatively laterally offset, have substantially the same lateral extent, and are sufficiently greatly laterally offset as to not oppose each other across the insulative film, e.g. such that the lateral offset distance between the write path forward and return path conductive traces is less than the lateral extent of the conductive traces. Typically, the write path conductive trace lateral offset is toward the read path conductive traces. Either the top trace conductor or the bottom trace conductor of the write pair can be offset toward the read pair.

The read pair of forward and return path conductive traces, and both the read and write pairs can be treated as just described for the write pair of conductive traces mutatis mutandis in further embodiments of the invention.

In further embodiments, both the write pair and the read pair of forward and return path conductive traces are relatively laterally offset, the respective conductive traces of the write pair and the read pair forward and return paths have substantially the same lateral extent within the pairs, and substantially the same or different lateral extent between the pairs, both the write pair and the read pair path forward and return path conductive traces are sufficiently greatly laterally offset as to not oppose each other across the insulative layer, the lateral offset distance between the write path, the read path, or both the write path and the read path forward and return conductive traces is less than the lateral extent of the conductive traces, the lateral offset distances respectively between the write pair forward and return path conductive traces and the read pair forward and return path conductive traces is less than the lateral extent of the conductive traces making up the pair, and the read and write path conductive trace lateral offsets are toward the write and read path conductive traces respectively.

In a further embodiment, the above electrical interconnect assembly further comprises a metal layer adapted for grounding, the metal layer being mounted on the insulative layer in fixed spaced relation to the conductive traces to be between the assembly and the load beam.

In a still further embodiment both the write pair and the read pair of forward and return path conductive traces are relatively laterally offset, and one or both of the respective conductive traces of the write pair and the read pair forward and return paths have substantially the same lateral extent within the pairs, and substantially the same or different lateral extent between the pairs, one or both of the write pair and the read pair path forward and return path conductive traces are sufficiently greatly laterally offset as to not oppose each other across the insulative layer, the lateral offset distance between the laterally offset write or read path forward and return path conductive traces that are offset is less than the lateral extent of the greater extending of the conductive traces, the lateral offset distance between the write or read path forward and return path conductive traces that are offset is less than the lateral extent of the conductive traces, at least one of the read and write path conductive trace lateral offsets are toward the write and read path conductive traces respectively.

In a further embodiment, the foregoing assembly can be in combination with a load beam comprised, e.g., of stainless steel. In this and like embodiments, the assembly can further comprise a metal layer adapted for grounding, the metal layer being mounted on the insulative layer in fixed spaced relation to the conductive traces to be between the assembly and the load beam, and the read and write pairs have the above-described characteristics.

The invention further provides a disk drive suspension comprising a metal load beam and an electrical interconnect assembly as described above including the interconnect assembly comprising an insulative layer, a read pair of forward and return path conductive traces bracketing a first portion of the insulative plastic film, a write pair of forward and return path conductive traces bracketing a second portion of the insulative layer, the read and write pairs of conductive traces being covered with a third portion of the insulative layer, and a metal layer adapted for grounding and mounted on the insulative plastic film in fixed spaced relation to the conductive traces to be between the assembly and the load beam, whereby the metal layer shields the traces from variations in impedance occasioned by varying distances between the electrical interconnect and the load beam.

The invention further provides a disk drive suspension comprising a metal load beam and an electrical interconnect assembly, wherein the interconnect assembly comprises an electrically insulative layer, a read pair of forward and return path conductive traces, a write pair of forward and return path conductive traces, the read and write pairs of conductive traces being supported by the insulative layer, and a metal layer adapted for grounding and mounted on the insulative plastic film in fixed spaced relation to the conductive traces to be between the assembly and the load beam, the insulative layer surrounding the conductive traces opposite the metal layer, whereby the metal layer shields the traces from variations in impedance occasioned by varying distances between the electrical interconnect and the load beam.

In its method aspects, the invention provides a method of making a disk drive suspension comprising a load beam and an electrical interconnect assembly, including supporting on an insulative layer adjacent the load beam a read pair of forward and return path conductive traces and a write pair of forward and return path conductive traces, covering the read and write pair conductive traces opposite the load beam with a further insulative layer, and attaching a metal layer adapted for grounding to the further insulative layer in fixed spaced relation to the conductive traces to be between the assembly and the load beam.

In a further embodiment, the invention provides a method of making a disk drive suspension electrical interconnect assembly, including supporting on an insulative layer a read pair of forward and return path conductive traces in insulative layer bracketing relation to a first portion of the insulative layer and a write pair of forward and return path conductive traces in bracketing relation to a second portion of the insulative layer, and relatively laterally offsetting the conductive traces of at least one the read and write pairs.

In a further embodiment, the invention provides a method of making a disk drive suspension comprising a metal load beam and an electrical interconnect assembly, including supporting on an insulative plastic layer a read pair of forward and return path conductive traces and a write pair of forward and return path conductive traces, relatively laterally offsetting the conductive traces of at least one of the read and write pairs, and attaching a metal layer adapted for grounding to the insulative plastic layer in fixed spaced relation to the conductive traces to be between the assembly and the load beam.

In a further method embodiment, the invention provides a method of making a disk drive suspension electrical interconnect assembly, including supporting on an insulative plastic layer a read pair of forward and return path conductive traces in layer bracketing relation and a write pair of forward and return path conductive traces in layer bracketing relation, and relatively laterally offsetting the conductive traces of at least one of the read pair and said write pair. This and similar ones of the method embodiments typically further including attaching a conductive metal layer to the insulative plastic layer in fixed spaced relation to the conductive traces, and grounding the metal layer in the installed condition of said electrical interconnect in a disk drive suspension.

BRIEF DESCRIPTION OF THE SEVERAL VIEWS OF THE DRAWINGS

The invention will be further described in conjunction with the attached drawings in which:

FIG. 2 is a view taken on line 2—2 in FIG. 1A;

FIG. 3 is a view like FIG. 2 of an alternative embodiment;

DETAILED DESCRIPTION OF THE INVENTION

Figure 1A:
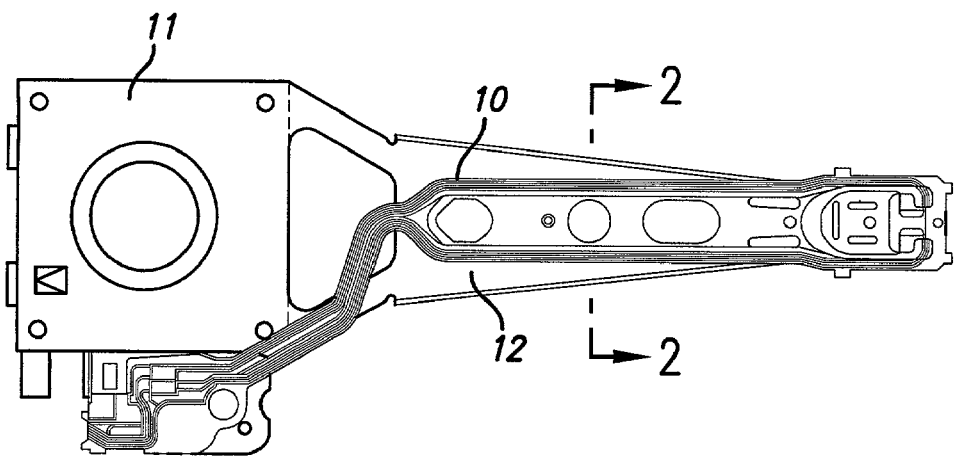
FIG. 1A is a top plan view of the invention suspension.

Disk drive interconnects supporting read and write channels demand controlled and constant impedance over the trace circuit path lengths between the pre-amplifier integrated circuit (IC) and the read-write (R/W) head.

For interconnects having multi-layered laminated structure, a common method for varying impedance has been by having present or not a metal sheet backing or support below the conductors at prescribed intervals. In a typical situation the write trace pair is required to have higher impedance than the read pair. The manufacturer uses "windowing" to provide a sequence of "backed" and "unbacked" portions create windowed sections, characterized by less or no metal backing, beneath the read and write traces.

It has been found, however, that the use of an arrangement of backed and un-backed portions causes local variations in impedance, this even where their spacing is kept smaller than the signal wavelength. Such fluctuations are not desirable.

As is known, capacitance (which plays a major role in determining the impedance) of a conductor, varies as a function of its proximity with nearby conductive objects. In the windowing method, impedance control is achieved by changing the spacing between the traces and the nearest metallic surface to reduce their capacitance. In a typical suspension, however, this provides only a small range of capacitance control because the nearest metal object, the load beam which is the one metal object that is most influential in controlling capacitance can not be far removed.

Further, removing the metal backing variably affects spacing because of possible warping or sagging of the unsupported structure. Spacing variations can give rise to additional ripples in the trace impedance.

Laminated head suspension systems having multiple conductor layers can comprise three layers including top and bottom layers consisting of metallic (preferably copper) traces and a thin insulating layer such as a plastic layer or film preformed or formed in situ sandwiched between them. These layers can be formed by additive or subtractive processes; that is by building up the several layers into a laminate assembly, or by taking a laminate assembly and selectively removing portions of the layers until the desired assembly is achieved. In a typical case, a pair of upper and lower traces facing each other across the insulative film layer form a single circuit, be it a read or a write circuit.

In forming these traces by a subtractive process, it is usual that chemical etching does not produce traces having perfectly rectangular cross sections. Rather the cross section is trapezoidal. In any case, the flat surfaces of the traces facing each other make a strong electrical coupling between the forward and the return paths of the circuit. By design, this coupling can be enhanced so that it dictates most of the electrical characteristics of the differential pair.

In various embodiments, an insulating layer, a fourth layer, may be coated over the lower metal layer and a further conductive layer deposited over that insulation layer to provide a five-layer structure that is supported by the load beam. Deposition of the added metal layer can be by sputtering or by electrolytic means, or a metal foil can be used.

The integrated lead suspension assembly structure can be used to form the suspension flexure suspension for the RAN head. It can be attached to the load beam and other suspension parts by welding or by adhesives.

As noted above, controlling the conductor proximity to metallic objects effects a control of conductor impedance. Thus, the mentioned added metal layer effectively shields the differential circuits above it, from the electrical influences exerted by the structural parts (the load beam, actuator arm, etc.). For example, tying the added metal layer with the load beam to a common potential (preferably the drive ground), limits variations in characteristic impedance of the R/W interconnects caused by changes in the structural support (such as variations in gap (x) between the load beam and the interconnect) and these variations can be minimized. The thickness of the added insulative layer, fourth layer, can be precisely maintained, thus positioning the fifth layer precisely, and limiting impedance variations irrespective of the uncertainties in the gap or spacing (x) caused by changes in the spatial relation of the interconnect and the load beam.

While the added metal layer acts as an electrical shield, it has only minimum influence on the electrical properties of the interconnect differential pairs, owing to the relatively large spacing between the added fifth layer of metal and the signal traces.

The invention in a major aspect controls impedance. As explained below, the electrical behavior (and hence the differential characteristic impedance) of a circuit can be varied by changing the lateral offset (d) between opposed trace conductor pairs of a circuit, such as between the forward and return paths of a read or write circuit. In this context, (d) can assume a positive or a negative value.

Figure 4:
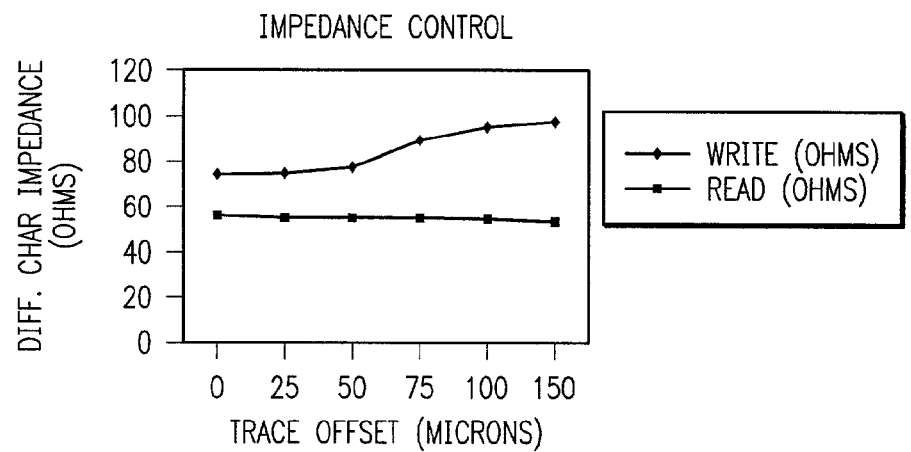
FIG. 4 is a graphical depiction of the invention impedance control on read and write circuits.
Figure 6:
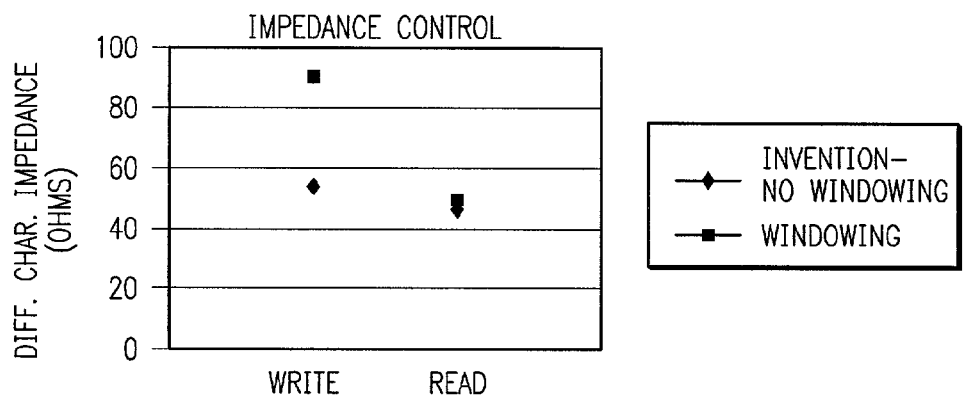

The invention provides the advantage of obtaining a constant (ripple-free) impedance that can be smoothly controlled. At the same time, the range of impedance control achieved is comparable to that of the 'windowing method' (assuming the same trace cross-section). In FIG. 4 simulation values obtained in two cases are provided wherein impedance of the write trace alone was varied using the prior art and the invention methods. In both the cases read trace geometry was kept intact. It will be noted that the change in impedance with increasing offset or (d) spacing in the write circuit is realized with little correlative change in the read circuit impedance. Similarly, it will be noted that for a range of impedance control of about 30 ohms, the read circuit varied by less than about 2 ohms with the invention, see FIG. 4, having no windowing expedient, but was about three times that, at about 7 ohms, see FIG. 6, with a windowing arrangement. It is thus demonstrated that impedance control by the invention method on the write traces produces less impact on the impedance of the read traces in the invention method than heretofore obtained.

Figure 5:
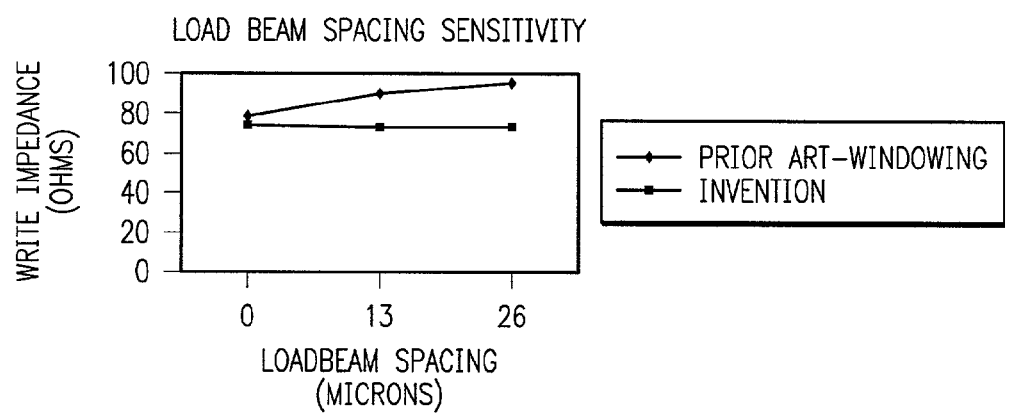
FIG. 5 is a graphical depiction of write impedance sensitivity under the invention and in the prior art at different spacings of the write circuit from the load beam; and, FIG. 6 is a graphical depiction of differential characteristic impedance under the invention and the prior art.

The sensitivity of impedance values to uncertainties in the attachment process that produce differences in load beam spacing (d) is reduced in the invention. In FIG. 5, the invention and the prior art are compared with respect to variation in the write circuit impedance caused by changes in the load beam spacing, keeping the value of (d) at zero for the invention. The data indicate that interconnects using the prior art windowing technique is more sensitive to load beam spacing than interconnects according to the invention.

Figure 1B:
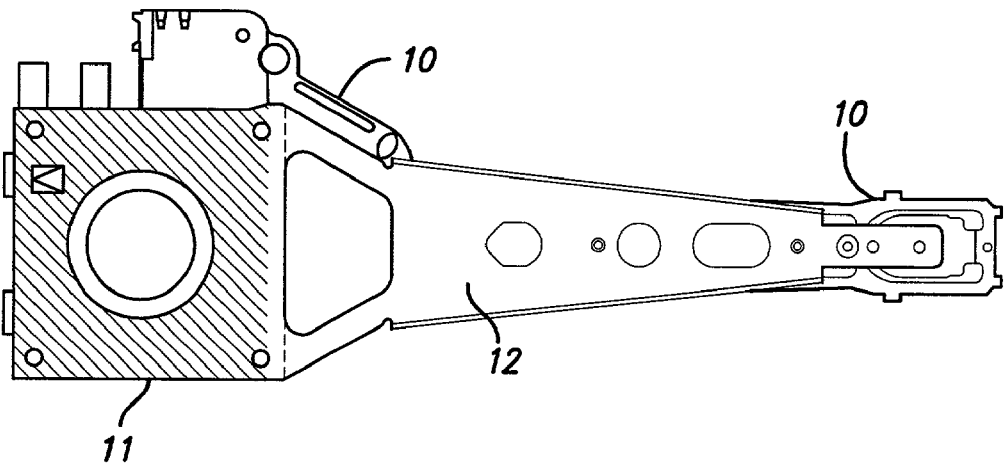
FIG. 1B is a bottom plan view thereof.

With reference now to the drawings in detail, in FIGS. 1A, 1B and 2 the invention interconnect assembly 10 is shown disposed on and fastened to load beam 12 that has a mounting plate 11. Assembly 10 comprises a conductive metal layer 13 (LAYER-1 in FIG. 2) suitably shaped into upper conductive traces 15, 23 and typically covered by an insulative plastic abrasion protective cover layer (not shown), an electrically insulative layer usually comprising a plastic layer 18 (LAYER-2 in FIG. 2), a second conductive metal layer 19 (LAYER-3 in FIG. 2) suitably shaped into lower conductive traces 16, 24, a further insulative plastic layer 20 (LAYER-4 in FIG. 2), and a deposited, or laminated metal foil, layer 21 (LAYER-5 iN FIG. 2). Attachment of the interconnect assembly 10 to the load beam is at a spacing that is intended to be relatively uniform but which frequently varies giving rise to certain of the impedance variations discussed herein.

Interconnect assembly 10, locally attached to load beam 12, comprises a write pair 14 of forward and return path conductive traces 15, 16 bracketing insulative plastic film 18, and a read pair 22 of forward and return path conductive traces 23, 24 bracketing the insulative layer 18. As shown in FIG. 2, at least one of the read and write pairs, here write pair 14 has its forward and return path conductive traces 15, 16 relatively laterally offset by a distance d measured from the center line of the traces and not equal to the distance between the respective spaced edges 26, 28 of the traces. The read pair 22 traces 23, 24 can be non-offset (FIG. 2 solid lines) or laterally offset (FIG. 2 dotted lines) alone or with the same or different lateral offset in the complementary write pair 14 traces 15, 16. Cf. FIG. 3.

The write and read conductive traces 15, 16 and 23, 24 bracket adjacent portions 29, 30 of the common insulative layer 18. Preferably, the conductive traces 15, 16 and 23, 24 comprise copper including copper alloys but other suitably conductive metal can be used.

When relatively offset (by distance d) read pair forward and return path conductive traces 23, 24 are relatively laterally offset transverse to the longitudinal axis of the assembly 10, and can each have substantially the same lateral extent and cross-section shape and areas, or different lateral extents and cross-section shapes and areas, including both rectangular and trapezoidal cross-sections. The write circuit traces 15, 16 can have a limited lateral extent to ensure that, when sufficiently laterally offset, they do not oppose each other across the insulative film layer portion 29. Preferably, the lateral offset distance d between the write path forward and return path conductive traces 15, 16 is less than the lateral extent L of the conductive traces, and the offset of the write path conductive traces 15, 16 is toward the read path conductive traces 23, 24.

The read pair 22 of forward and return path conductive traces 23, 24 are relatively located, shaped and sized as the write traces 15, 16, and can be larger than the write traces in lateral extent and cross-sectional area, as shown in FIG. 2.

With reference to FIG. 3, both the write pair 14 and the read pair 22 of forward and return path conductive traces 15, 16, 23, 24 are relatively laterally offset, the respective conductive traces of the write pair and the read pair forward and return paths having substantially the same lateral extent within the pairs, and substantially the same or different lateral extent between the pairs. Both the write pair 14 and the read pair 22 forward and return paths conductive traces 15, 16, 23, 24 can be sufficiently greatly laterally offset as to not oppose each other across the insulative layer portions 29, 30. The lateral offset distance d between the write path, the read path, or both the write path and the read path forward and return conductive traces 15, 16, 23, 24 can be less than the lateral extent L of the conductive traces, while the lateral offset distances respectively between the write pair forward and return path conductive traces 15, 16 and the read pair forward and return path conductive traces 23, 24 can be less than the lateral extent of the conductive traces making up the pair. Further, the write and read conductive trace 15, 16, 23, 24 lateral offsets d occur or are found toward the read and write path conductive traces respectively.

In a further embodiment, also shown in FIG. 2, the electrical interconnect assembly 10 further comprises a metal layer 21 adapted for grounding to the load beam 12, mounting plate 11 or other grounded object. Metal layer 21 is mounted on the insulative layer 18 in fixed spaced relation to the conductive traces 15, 16, 23, 24 to be between the interconnect assembly 10 and the load beam 12 in the assembled condition of the interconnect assembly and the load beam.

In this and further embodiments, both the write pair 15 and the read pair 22 of forward and return path conductive traces 15, 16, 23, 24 are relatively laterally offset a distance d, and one or both of the respective conductive traces of the write pair and the read pair forward and return paths have substantially the same lateral extent within the pairs, and substantially the same or different lateral extent between the pairs, one or both of the write pair and the read pair path forward and return path conductive traces are sufficiently greatly laterally offset as to not oppose each other across the insulative film, the lateral offset distance between the laterally offset write or read path forward and return path conductive traces that are offset is less than the lateral extent of the greater extending of the conductive traces, and the lateral offset distance between the write or read path forward and return path conductive traces that are offset is less than the lateral extent of the conductive traces, at least one of the read and write path conductive trace lateral offsets are toward the write and read path conductive traces respectively.

The interconnect assembly 10 can, as shown, be combined with load beam 12, typically comprised of stainless steel or other spring material. The interconnect assembly 10 is otherwise as above-described.

The invention method of making a disk drive suspension comprising a load beam 12 and an electrical interconnect assembly 10 includes supporting on an insulative layer 18 adjacent the load beam a write pair 14 of forward and return path conductive traces 15, 16 and a read pair 22 of forward and return path conductive traces 23, 24, covering the write and read pair conductive traces opposite the load beam with a further insulative layer 20, and attaching a metal layer 21 adapted for grounding to the further insulative layer in fixed spaced relation to the conductive traces to be between the assembly and the load beam.

Further, the invention provides a method of making a disk drive suspension electrical interconnect assembly 10, including supporting on an insulative layer 18 a write pair 14 of forward and return path conductive traces 15, 16 in insulative layer bracketing relation to a first portion 181 of the insulative layer and a read pair 22 of forward and return path conductive traces 23, 24 in bracketing relation to a second portion 182 of the insulative layer, and relatively laterally offsetting the conductive traces of at least one the read and write pairs a distance d.

Further, the invention provides a method of making a disk drive suspension comprising a metal load beam 12 and an electrical interconnect assembly 10, including supporting on an insulative plastic layer 18 a write pair 14 of forward and return path conductive traces 15, 16 and a read pair 22 of forward and return path conductive traces 23, 24, in bracketing relation if desired, relatively laterally offsetting the conductive traces of at least one of the read and write pairs, and attaching a metal layer 21 adapted for grounding to the insulative plastic layer in fixed spaced relation to the conductive traces to be between the assembly and the load beam 12.

The invention thus provides an improved disk drive suspension and an electrical interconnect for a disk drive suspension having improved impedance control for reduced cross talk through opposing the circuit pair members in a novel manner involving offset partly or fully of the opposed pair members, and for reduced effect of the load beam spacing through the use of a grounding layer of metal at a fixed spacing from the trace conductors although at a varied spacing from the trace conductors. The invention further provides a read pair of forward and return path conductive traces on or bracketing an insulative layer, such as a plastic film layer in which the pair members are relatively laterally offset to control impedance including differentially between read and write pairs, and in which the effects of load beam spacing are controlled through the use of a metal layer constantly spaced from the traces and spaced as well from the load beam. The invention further provides an electrical interconnect geometry that enhances electrical coupling between the forward and return paths of a differential circuit thereby making it less sensitive to exterior factors and cross-talk noise, provision of a geometry that allows enhancement of capacitive coupling between the forward and return paths of a differential circuit, thereby making possible the realization of very low impedance interconnects, provision of a vertically stacked interconnect geometry that allows more circuits to be packed in a given area, provision of a shield that is electrically commonly grounded with the load beam to nearby metallic objects and supports supporting the interconnect structure and that maintains a constant spacing from the differential circuit, the shield protecting the differential circuits from impedance variations caused by a non-uniform attachment process with the metallic supports, such as load beams and arms, provision of ripple-free differential characteristic impedance through homogenous shielding and uniform trace cross-sectional geometry, provision of smooth and continuous control of differential impedance by setting the offset parameter to the desired value, provision of impedance control in which changing the impedance of a certain differential pair does not significantly affect the impedance of adjacent pairs, and provision of a flexure through the interconnect assembly.

The foregoing objects are thus met.

We claim:

1. An electrical interconnect assembly adapted to be supported on a disk drive suspension load beam, said interconnect assembly comprising a read pair of forward and return path conductive traces bracketing a common insulative layer each in directly attached relation, and a write pair of forward and return path conductive traces bracketing an insulative layer each in directly attached relation, each said conductive trace having a center line and left and right edges on either side of said center line, at least one of said read and write pairs having its said conductive trace center lines and its said conductive trace left and right edges relatively laterally offset.

2. In combination: the electrical interconnect assembly according to claim 1, and a load beam comprised of stainless steel.

3. The electrical interconnect assembly according to claim 1, in which said read and write conductive traces bracket adjacent portions of a said common insulative layer.

4. The electrical interconnect assembly according to claim 1, in which said conductive traces comprise copper.

5. The electrical interconnect assembly according to claim 1, in which said write pair of forward and return path conductive traces are relatively laterally offset.

6. The electrical interconnect assembly according to claim 5, in which said write pair forward and return path conductive traces have substantially the same lateral extent.

7. The electrical interconnect assembly according to claim 6, in which said write pair forward and return path conductive traces are sufficiently greatly laterally offset as to not oppose each other across said insulative layer.

8. The electrical interconnect assembly according to claim 7, in which the lateral offset distance between said write path forward and return path conductive traces is less than the lateral extent of said conductive traces.

9. The electrical interconnect assembly according to claim 8, in which said write path conductive trace lateral offset is toward said read path conductive traces.

10. The electrical interconnect assembly according to claim 1, in which said read pair of forward and return path conductive traces are relatively laterally offset.

11. The electrical interconnect assembly according to claim 10, in which said read pair forward and return path conductive traces have substantially the same lateral extent.

12. The electrical interconnect assembly according to claim 11, in which said read pair forward and return path conductive traces are sufficiently greatly laterally offset as to not oppose each other across said insulative layer.

13. The electrical interconnect assembly according to claim 12, in which the lateral offset distance between said read path forward and return path conductive traces is less than the lateral extent of said conductive traces.

14. The electrical interconnect assembly according to claim 13, in which said read path conductive trace lateral offset is toward said write path conductive traces.

15. The electrical interconnect assembly according to claim 1, and a metal layer adapted for grounding between said assembly and said load beam.

16. The electrical interconnect assembly according to claim 15, in which one or both of said write pair and said read pair of forward and return path conductive trace center lines and left and right edges are relatively laterally offset.

17. The electrical interconnect assembly according to claim 15, in which one or both of the respective conductive traces of said write pair and said read pair forward and return paths have substantially the same lateral extent within said pairs, and substantially the same or different lateral extent between said pairs.

18. The electrical interconnect assembly according to claim 15, in which one or both of said write pair and said read pair path forward and return path conductive traces are sufficiently greatly laterally offset as to not oppose each other across said insulative layer.

19. The electrical interconnect assembly according to claim 15, in which the lateral offset distance between said laterally offset write or read path forward and return path conductive trace center lines that are offset is less than the lateral extent of the greater extending of said conductive traces.

20. The electrical interconnect assembly according to claim 15, in which the lateral offset distance between said write or read path forward and return path conductive trace center lines that are offset is less than the lateral extent of said conductive traces.

21. The electrical interconnect assembly according to claim 15, in which at least one of said read and write path conductive trace lateral offsets are toward said write and read path conductive traces respectively.

22. In combination: an electrical interconnect assembly adapted to be supported on a disk drive suspension load beam, said interconnect assembly comprising a read pair of forward and return path conductive traces bracketing a common insulative plastic layer each in directly attached relation, and a write pair of forward and return path conductive traces bracketing said common insulative plastic layer each in directly attached relation, at least one of said read and write pairs having its said forward and return path conductive traces relatively laterally offset; and a metal layer adapted for grounding, said metal layer being between said assembly and said load beam.

23. The electrical interconnect assembly according to claim 22, in which one or both of the respective conductive traces of said write pair and said read pair forward and return paths have substantially the same lateral extent within said pairs, and substantially the same or different lateral extent between said pairs.

24. The electrical interconnect assembly according to claim 22, in which one or both of said write pair and said read pair path forward and return path conductive traces are sufficiently greatly laterally offset as to not oppose each other across said insulative layer.

25. The electrical interconnect assembly according to claim 24, in which the lateral offset distance between said laterally offset write or read path forward and return path conductive traces that are offset is less than the lateral extent of the greater extending of said conductive traces.

26. The electrical interconnect assembly according to claim 25, in which the lateral offset distance between said write or read path forward and return path conductive traces that are offset is less than the lateral extent of said conductive traces.

27. The electrical interconnect assembly according to claim 26, in which at least one of said read and write path conductive trace lateral offsets are toward said write and read path conductive traces respectively.

28. In combination: the combination according to claim 22, and a load beam.

29. A disk drive suspension comprising a metal load beam and an electrical interconnect assembly, said interconnect assembly comprising an insulative layer, a read pair of forward and return path conductive traces bracketing a first portion of said insulative layer in directly attached relation and a write pair of forward and return path conductive traces bracketing a second portion of said insulative layer in directly attached relation, at least one of said read and write pairs having its forward and return path conductive traces relatively laterally offset across said insulative layer, and a metal layer adapted for grounding and mounted to a further portion of said insulative layer beyond said read and write pairs and their said conductive traces and between said interconnect assembly and said load beam, whereby said metal layer shields said traces from variations in impedance occasioned by varying distances between said electrical interconnect and said load beam.

30. The disk drive suspension according to claim 29, in which said metal layer is connected to ground.

31. The disk drive suspension according to claim 29 in which one or both of the respective conductive traces of said write pair and said read pair forward and return paths have substantially the same lateral extent within said pairs, and substantially the same or different lateral extent between said pairs.

32. The disk drive suspension according to claim 29, in which one or both of said write pair and said read pair path forward and return path conductive traces are sufficiently greatly laterally offset as to not oppose each other across said insulative layer.

33. The disk drive suspension according to claim 29, in which the lateral offset distance between said laterally offset write or read path forward and return path conductive traces that are offset is less than the lateral extent of the greater extending of said conductive traces.

34. The disk drive suspension according to claim 29, in which the lateral offset distance between either or both of said write and read path forward and return path conductive traces that are offset is less than the lateral extent of said conductive traces.

35. The disk drive suspension according to claim 29, in which at least one of said read and write path conductive trace lateral offsets are toward said write and read path conductive traces respectively.

36. The electrical interconnect assembly according to claim 29, in which one or both of the respective conductive traces of said write pair and said read pair forward and return paths have substantially the same lateral extent within said pairs, and substantially the same or different lateral extent between said pairs.

37. The electrical interconnect assembly according to claim 36, in which one or both of said write pair and said read pair path forward and return path conductive traces are sufficiently greatly laterally offset as to not oppose each other across said insulative layer.

38. The electrical interconnect assembly according to claim 37, in which the lateral offset distance between said laterally offset write or read path forward and return path conductive traces that are offset is less than the lateral extent of the greater extending of said conductive traces.

39. The electrical interconnect assembly according to claim 38, in which the lateral offset distance between said write or read path forward and return path conductive traces that are offset is less than the lateral extent of said conductive traces.

40. The electrical interconnect assembly according to claim 39, in which at least one of said read and write path conductive trace lateral offsets are toward said write and read path conductive traces respectively.

41. A method of making a disk drive suspension electrical interconnect assembly, including supporting an insulative layer a read pair of forward and return path conductive traces in insulative layer directly attached and bracketing relation to a first portion of said insulative layer and a write pair of forward and return path conductive traces in insulative layer directly attached and bracketing relation to a second portion of said insulative layer, and relatively laterally offsetting the respective center lines and left and right edges of said conductive traces of at least one said read and write pairs.

42. A method of making a disk drive suspension comprising a metal load beam and an electrical interconnect assembly, including supporting on an insulative plastic layer in directly attached and bracketing relation a read pair of forward and return path conductive traces and a write pair of forward and return path conductive traces, relatively laterally offsetting the respective center lines and left and right edges of said conductive traces of at least one said read and write pairs, and attaching a metal layer adapted for grounding to said insulative plastic layer beyond all said conductive traces and between said interconnect assembly and said load beam.

43. A method of making a disk drive suspension electrical interconnect assembly to be supported by a load beam, including supporting on an insulative plastic layer a read pair of forward and return path conductive traces in insulative plastic layer directly attached and bracketing relation and a write pair of forward and return path conductive traces in insulative plastic layer directly attached and bracketing relation, and relatively laterally offsetting the center lines of said conductive traces of at least one of said read pair and said write pair where said pair brackets said insulative plastic layer.

44. The method according to claim 43, including also attaching a conductive metal layer to said interconnect assembly insulative plastic layer beyond all said conductive traces and between said insulative plastic layer and said load beam, and grounding said metal layer in the installed condition of said electrical interconnect assembly in a disk drive suspension.

* * * * *